(12) United States Patent
Heisler et al.

(10) Patent No.: US 10,465,420 B2
(45) Date of Patent: Nov. 5, 2019

(54) LOCKING SYSTEM FOR A DOOR

(71) Applicant: DORMAKABA USA INC., Indianapolis, IN (US)

(72) Inventors: Daniel Heisler, Troy, MI (US); Kyle Stopczynski, Shelby Township, MI (US); James Mills, Brossard (CA); Leo Laperriere, Laval (CA); Sylvain Martel, Laval (CA)

(73) Assignee: DORMAKABA USA INC., Indianapolis, IN (US)

( * ) Notice: Subject to any disclaimer, the term of this patent is extended or adjusted under 35 U.S.C. 154(b) by 0 days.

(21) Appl. No.: 16/374,985

(22) Filed: Apr. 4, 2019

(65) Prior Publication Data

US 2019/0226237 A1 Jul. 25, 2019

Related U.S. Application Data

(63) Continuation of application No. 15/685,717, filed on Aug. 24, 2017.
(Continued)

(51) Int. Cl.
*E05B 47/00* (2006.01)
*G07C 9/00* (2006.01)
(Continued)

(52) U.S. Cl.
CPC ............ *E05B 47/0012* (2013.01); *E05B 9/02* (2013.01); *E05B 63/042* (2013.01);
(Continued)

(58) Field of Classification Search
None
See application file for complete search history.

(56) References Cited

U.S. PATENT DOCUMENTS

| D308,521 S | 6/1990 | Lonczak |
| D321,883 S | 11/1991 | Borchardt |

(Continued)

FOREIGN PATENT DOCUMENTS

| DE | 10 2015 000288 A1 | 7/2016 |
| JP | H11-200675 A | 7/1999 |

(Continued)

OTHER PUBLICATIONS

Notice of Allowance issued for U.S. Appl. No. 15/685,717 dated May 23, 2019, 15 pages.
(Continued)

*Primary Examiner* — Dionne Pendleton
(74) *Attorney, Agent, or Firm* — Rothwell, Figg, Ernst & Manbeck, P.C.

(57) ABSTRACT

The locking system is provided for controlling the unlocking of a door by an electronic key. The locking system has a first pack configured to be received within a first recessed area of the door, the first pack having an actuator configured and adapted to move a bolt slidingly housed in the lock pack; a second pack configured to be received within a second recessed area of the door; a reader interface adapted to receive an input from the electronic key and a controller adapted to receive the input from the reader interface, authenticate the input, and control the actuator based on the authentication.

23 Claims, 12 Drawing Sheets

Related U.S. Application Data (60) Provisional application No. 62/379,846, filed on Aug. 26, 2016.

(51) Int. Cl.
    *E05B 9/02* (2006.01)
    *E05B 63/04* (2006.01)
    *E05B 65/00* (2006.01)

(52) U.S. Cl.
    CPC ...... *E05B 65/0032* (2013.01); *G07C 9/00309* (2013.01); *E05B 2047/0048* (2013.01); *E05B 2047/0058* (2013.01); *E05B 2047/0071* (2013.01); *G07C 9/00722* (2013.01); *G07C 2009/00769* (2013.01); *Y10T 292/1021* (2015.04); *Y10T 292/699* (2015.04)

(56) References Cited

U.S. PATENT DOCUMENTS

| | | |
|---|---|---|
| 5,100,186 A | 3/1992 | Nordvall |
| D327,690 S | 7/1992 | Ogawa et al. |
| D414,476 S | 9/1999 | Hibino |
| D421,658 S | 3/2000 | Ting |
| 6,117,010 A * | 9/2000 | Canterbury ......... G07F 17/3202 463/20 |
| D512,417 S | 12/2005 | Hirakawa et al. |
| 7,690,230 B2 | 4/2010 | Gray |
| 8,028,553 B2 | 10/2011 | Lange |
| 8,047,030 B2 | 11/2011 | Gray |
| 8,079,240 B2 * | 12/2011 | Brown .................. E05B 47/00 70/277 |
| 8,325,039 B2 | 12/2012 | Picard et al. |
| D696,769 S | 12/2013 | Schenck et al. |
| D713,825 S | 9/2014 | Witkowski et al. |
| 8,922,370 B2 | 12/2014 | Picard et al. |
| D729,214 S | 5/2015 | Beaudoin |
| D730,328 S | 5/2015 | Chun et al. |
| D732,512 S | 6/2015 | Fariello |
| D780,305 S | 2/2017 | Medugorac et al. |
| 2008/0218330 A1 * | 9/2008 | Biles .................. G07C 9/00571 340/506 |
| 2010/0140962 A1 | 6/2010 | Kim |
| 2014/0265359 A1 | 9/2014 | Cheng et al. |
| 2015/0089804 A1 | 4/2015 | Picard et al. |
| 2015/0176311 A1 | 6/2015 | Picard et al. |
| 2015/0259949 A1 | 9/2015 | Cheng |
| 2016/0017640 A1 | 1/2016 | Soloway et al. |
| 2016/0049026 A1 | 2/2016 | Johnson |
| 2016/0050515 A1 | 2/2016 | Johnson |
| 2017/0074011 A1 | 3/2017 | Chang |
| 2018/0096593 A1 | 4/2018 | Davis |

FOREIGN PATENT DOCUMENTS

| | | |
|---|---|---|
| WO | 2006118444 A1 | 11/2006 |
| WO | 2009/158181 A1 | 12/2009 |
| WO | 2011/146960 A1 | 12/2011 |
| WO | 2012/119184 A1 | 9/2012 |

OTHER PUBLICATIONS

Search Report and Written Opinion issued for International Application No. PCT/US2017/048690 dated Jan. 15, 2018, 20 pages.

* cited by examiner

LOCKING SYSTEM FOR A DOOR

CROSS REFERENCE OF RELATED APPLICATION

This application is a continuation claiming the benefit under 35 U.S.C. §§ 120 of the filing date of non-provisional patent application Ser. No. 15/685,717, filed Aug. 24, 2017, which claims the benefit under 35 U.S.C. § 119(e) of the filing date of provisional patent application Ser. No. 62/379, 846 filed on Aug. 26, 2016, the disclosures of which are incorporated herein in their entirety by reference.

FIELD

The improvements generally relate to the field of locking systems of the mortise type for doors of buildings, and more particularly to locking systems featuring electronic key activation.

BACKGROUND

Electronic key activated locking systems are widely used in hotels, motels and other rental dwellings, but are also used in some other applications. Such locking systems have a controller, typically provided in the form of a relatively simple computer, which can receive input from an electronic key via a "reader" interface, perform an authentication function determining whether or not the input from the electronic key is authorized to operate the lock, and controls a lock actuator to open the lock upon authorization.

Various technologies exist for electronic keys and reader interfaces, and these technologies typically involve the encoding of identifier data within the electronic key and the reading of the identifier data by the reader interface. Some technologies use passive keys (e.g., an RFID, card with magnetic stripe, etc.) whereas others can be active (e.g., a smartphone application which emits the identifier data in the form of a wireless signal). Similarly, various technologies exist in the art to perform the computer-implemented authorization function, and in terms of actuators to perform the physical unlocking function of the lock.

All these technologies typically require some form of maintenance to be required on the locking system. For instance, locking systems can require batteries to power the controller and the door actuator, to name two examples, and it can be required to change these batteries periodically to ensure a satisfactory operability. Some other mechanical or electronic components of the locking systems can also require maintenance.

Although known locking systems were satisfactory to a certain degree, there remained room for improvement. In particular, there was a need to facilitate the maintenance operations concerning the locking systems and/or to reduce maintenance-related costs.

SUMMARY

In one embodiment, the locking system has a primary pack received in a first recessed area of a mortise in the door. The primary pack has a bolt and an actuator for moving the bolt. The locking further has a secondary pack received in a second recessed area in the door. The secondary pack can house electronic components such as batteries, a controller, and a reader for instance.

In accordance with one aspect, the secondary pack has a frame which is secured to the door, and a tray slidably mounted to the frame and receiving one or more of the electronic components. The tray can be partially slid out from the recessed area in a manner to allow performing maintenance the electronic components without removing the frame from the door.

In accordance with another aspect, the door has an aperture leading into the second recessed area, and the secondary pack has a jack made integral to the frame and accessible via the aperture. A cover can be used to cover the aperture when the jack is not in use. Accordingly, maintenance personnel can remove the cover to connect a plug associated with a maintenance device into the jack, and thereby access the controller. The plug and jack can form a USB connector, or any other suitable connector, for instance.

In accordance with another aspect, there is provided a locking system for controlling the unlocking of a door by an electronic key, the locking system comprising: a pack configured to be received within a recessed area of the door; a reader interface adapted to receive an input from the electronic key and a controller adapted to receive the input from the reader interface, authenticate the input, and control the actuator based on the authentication, wherein the pack has a frame fastenable to the door, and a tray being slidably mounted to the frame in a manner that the tray can be slid out from the second recessed area to expose a portion thereof for maintenance.

In accordance with another aspect, there is provided a locking system for controlling the unlocking of a door by an electronic key, the locking system comprising: a pack configured to be received within a recessed area of the door; a reader interface adapted to receive an input from the electronic key and a controller adapted to receive the input from the reader interface, authenticate the input, and control the actuator based on the authentication, wherein the door has an aperture leading into the second recess, further comprising a maintenance jack secured to the frame and exposed to the aperture, and a cover removably securable to the door to cover the aperture.

In accordance with another aspect, there is provided a locking system for controlling the unlocking of a door by an electronic key, the locking system comprising: a pack configured to be received within a recessed area of the door; a reader interface adapted to receive an input from the electronic key and a controller adapted to receive the input from the reader interface, authenticate the input, and control the actuator based on the authentication, and a battery holder having a spring clip formed of a band of metal having a central depression and two legs securable to the pack, the central depression being elastically deformed by a battery when the battery is received between the central depression and the pack.

Many further features and combinations thereof concerning the present improvements will appear to those skilled in the art following a reading of the instant disclosure.

DESCRIPTION OF THE FIGURES

In the figures.

DETAILED DESCRIPTION

Figure 1A:
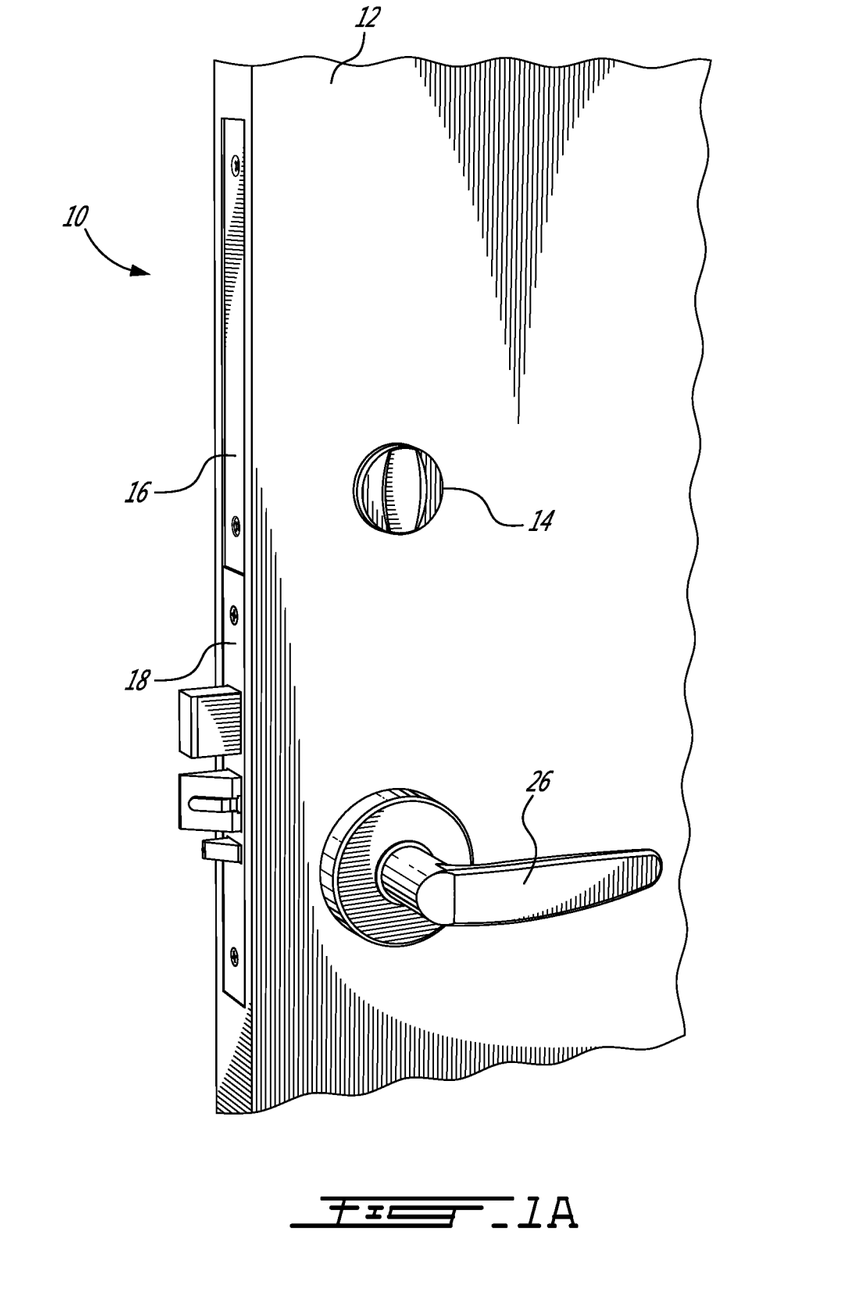
FIGS. 1A and 1B are views showing a door with an example locking system, from the outside and from the inside, respectively.
Figure 1B:
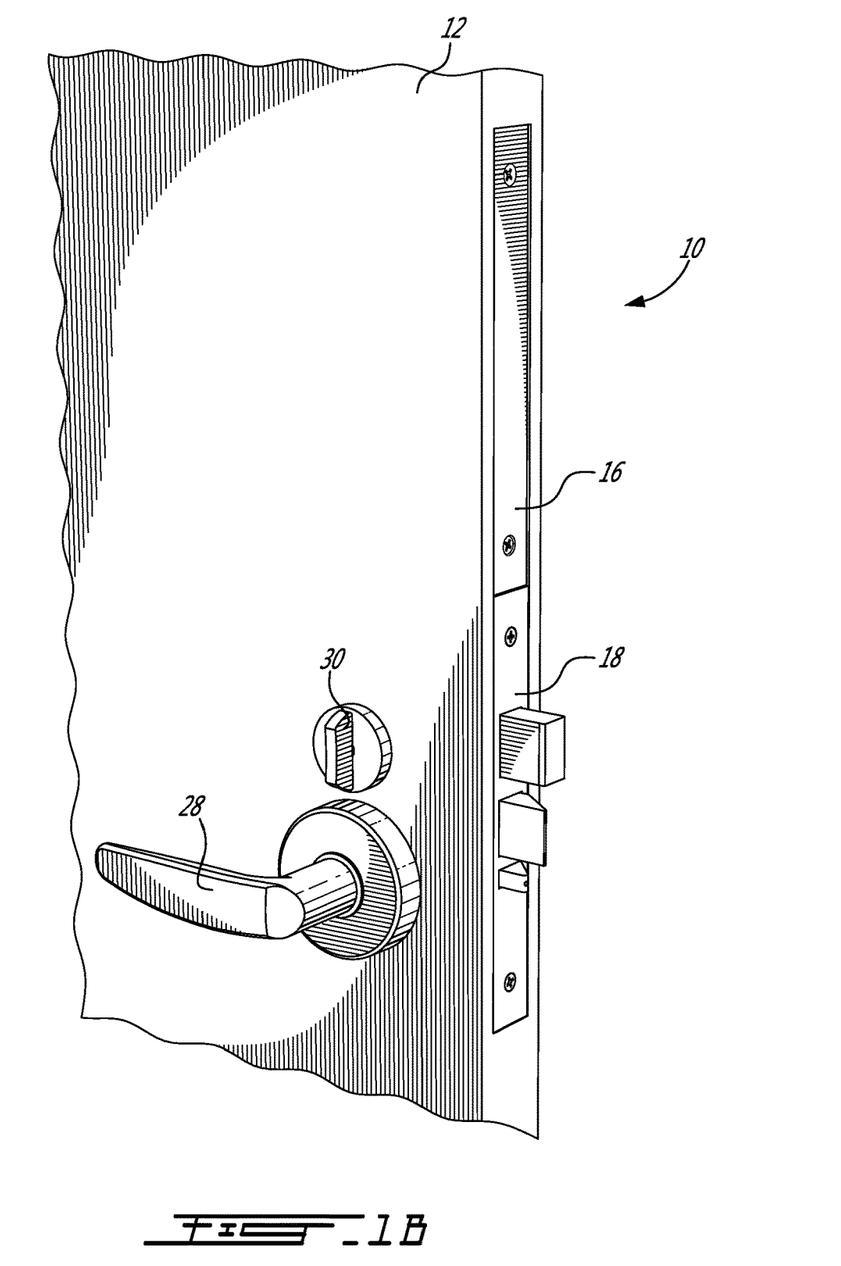

FIGS. 1A to 3B show an example of a locking system 10 adapted to a door 12 of a building, and more specifically to a door 12 such as a hotel room door in this case. FIG. 1A shows the external appearance of the door 12 whereas FIG. 1B shows the internal appearance of the door 12. It can be seen that the external appearance of the locking system 10 is minimized, with essentially only a reader cover 14 showing on the outside and face plates 16, 18 appearing along the edge of the door. During an access operation by a user, the user can be provided with an electronic key which he places proximate to the reader cover 14 to trigger the unlocking of the locking system 10. The user may then activate the handle 26 and open the door 12.

Figure 2:
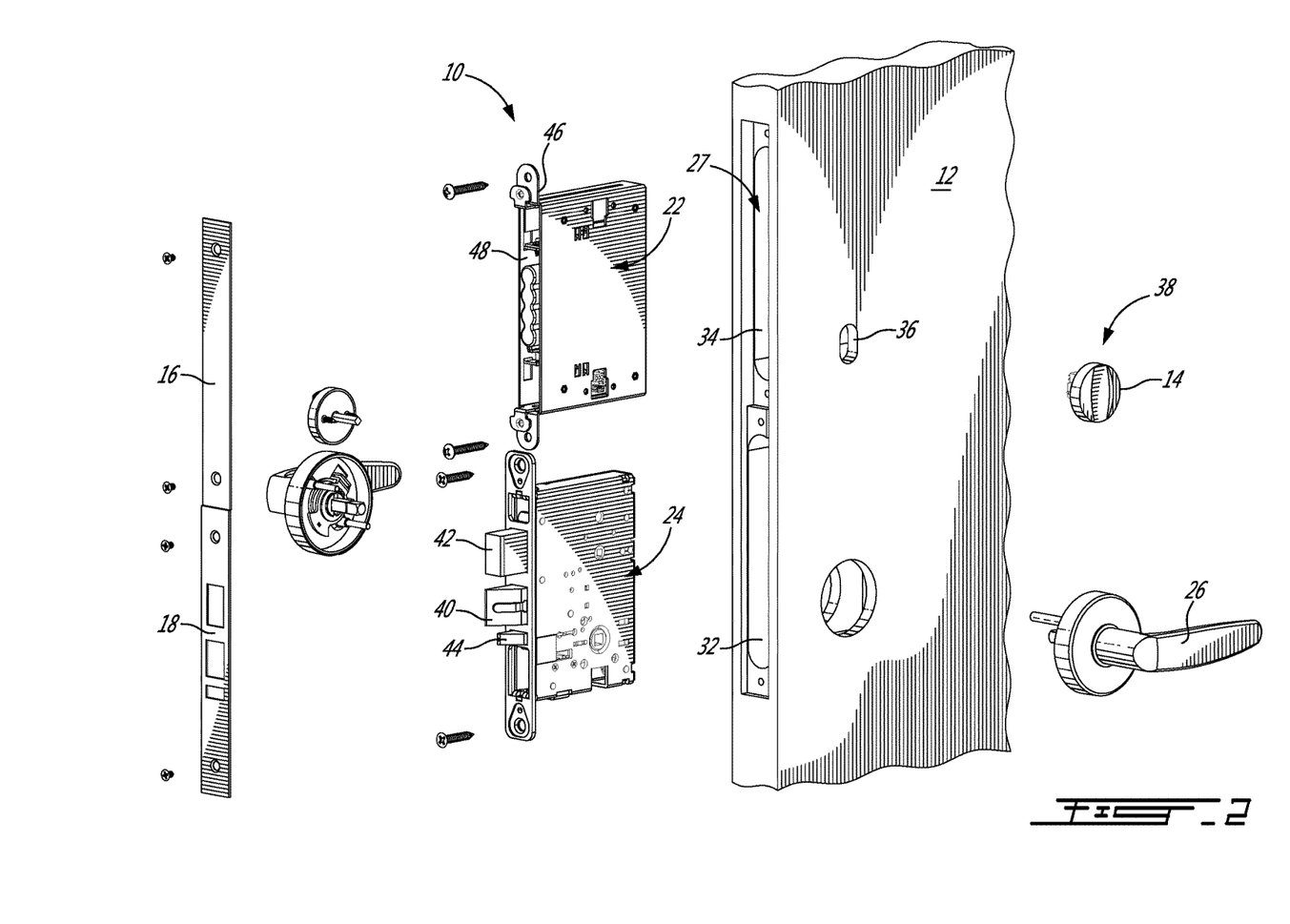
FIG. 2 is an exploded view of the locking system.

FIG. 2 shows the locking system 10 and door 12 exploded. The locking system 10 can be seen to include two separate packs 22, 24 which are both housed in a mortise 27 within the door 12. More specifically, the first pack 24, which can alternately be referred to as the bolt pack 24, has a housing which receives locking elements and a lock actuator which is operable to mechanically perform the unlocking function. The inner and outer door handles 26, 28, as well as the thumbturn 30 (FIG. 1B), are receive into the first pack 24 across corresponding apertures in the door 12. The second pack 22, which can alternately be referred to as the controller pack 22, houses electronic components. The first pack 24 is received within a first recessed area 32 in the door, whereas the second pack 22 is received within a second recessed area 34 in the door 12. In this embodiment, the recessed areas 32, 34 are separate from one another, but it will be understood that in an alternate embodiment, the recessed areas 32, 34 can be two portions of a single, larger, mortise. Accordingly, in an alternate embodiment, the first pack 24 and the second pack 22 can be embodied in the form of a single combined pack, for instance. The door 12 has an aperture 36 leading into the second recessed area 34, and across which the reader assembly 38 can be connected to the second pack 22. In this embodiment, the first pack 24 is provided with two locking elements: a sprung latch 40 at the middle, and a locking bolt 42 at the top; and further has a guard bolt 44 (auxiliary latch) at the bottom. It will be understood that various other configurations are possible in alternate embodiments.

Both the first pack 24 and the second pack 22 are provided in the form of folded sheet metal housings with an aperture face adapted to be anchored to a corresponding portion of the mortise by pack mounting screws. Both the first pack 24 and the second pack 22 are further provided with threaded bores. Face plates 16, 18 can be secured to the corresponding aperture faces of the packs to close and cover them by fastening faceplate mounting screws into the threaded bores. Typically, the mortise 27 is made of a wood based material, and it can be preferred to reduce the manipulation of the pack mounting screws as much as possible, as successive manipulations can damage the wood. The metal material of the threaded bores, which receive the faceplate mounting screws, is not subject to wear as much as the wood. As will be presented in further detail below, the second pack 22 has a frame portion 46 which is secured to the door 12 with the pack mounting screws, and a tray portion 48 which is slidingly mounted to the frame portion 46.

Figure 3A:
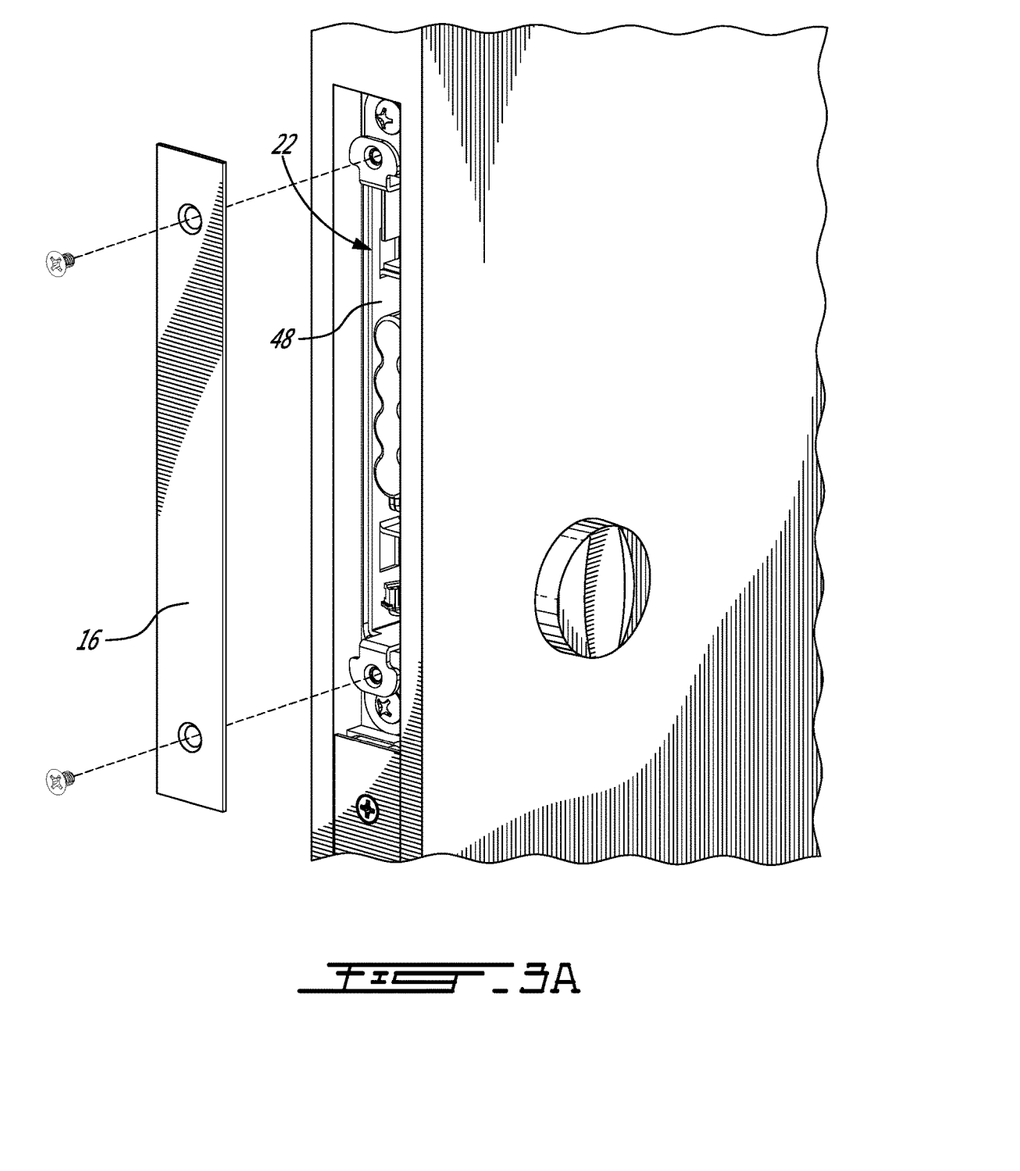
FIGS. 3A and 3B are views showing, in sequence, the sliding out of a tray of a second pack of the locking system and the removal of the reader antenna cover, for maintenance access.
Figure 3B:
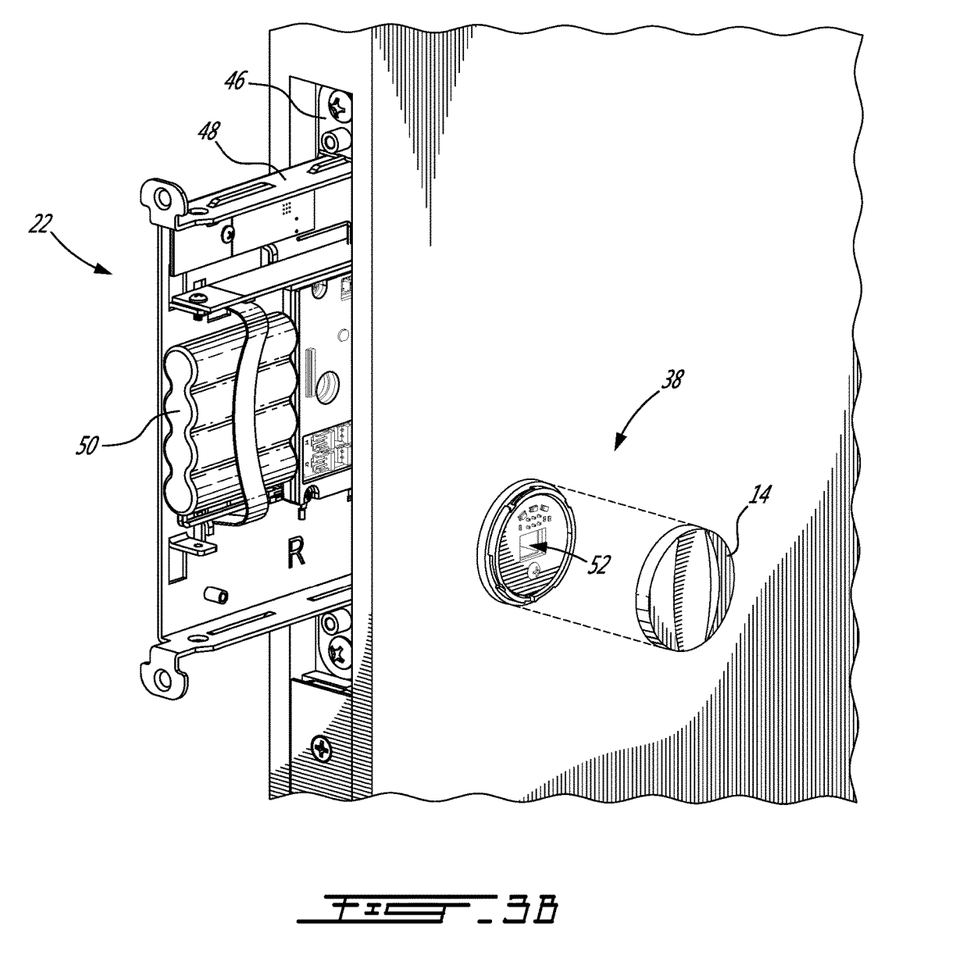

FIG. 3A shows the removal of the faceplate 16 of the second pack 22 which frees the tray portion 48 of the second pack 22. FIG. 3B shows the tray portion 48 of the second pack 22 fully slid into an extended configuration, exposing a portion of the tray portion 48. In the extended configuration, maintenance personnel can freely change batteries 50 or otherwise perform maintenance on the locking system 10 such as by accessing electronic components.

FIG. 3B also shows the reader assembly 38 with the cover 14 removed, allowing access to a maintenance port 52, thus allowing a wired connection of a maintenance device to the controller. As shown more clearly in FIG. 4, a maintenance jack 60 accessible via port 52 is secured to the frame portion 46, whereas the electronic components which are designed for maintenance can be secured to the tray portion 48.

Figure 4:
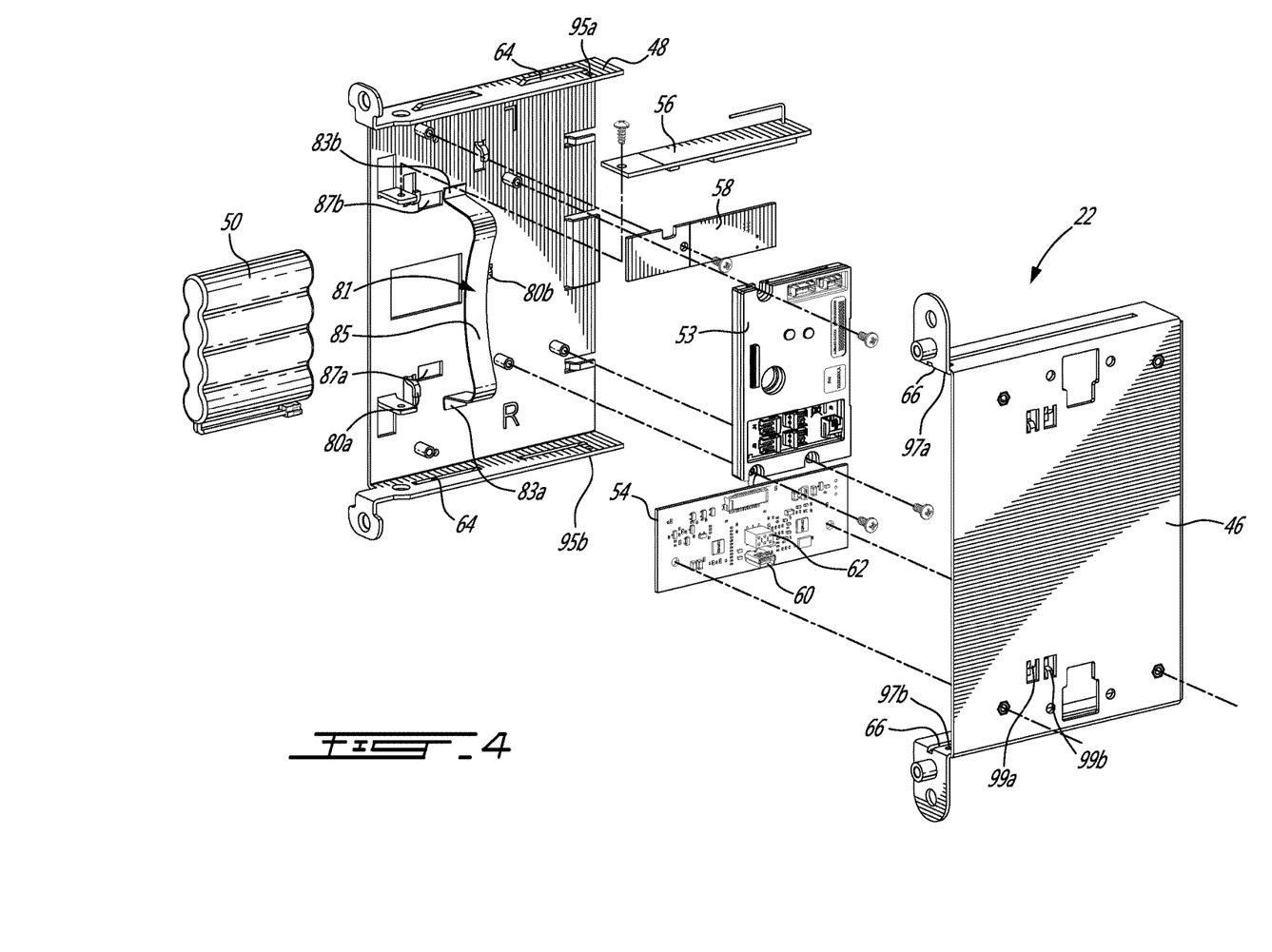
FIG. 4 is an exploded view of the second pack of the locking system.

FIG. 4 provides further detail concerning the components of the second pack 22 in this specific example. In this example, the components of the controller are mostly incorporated to a main printed circuit board (PCB) 53 which is received on the tray for easy maintenance access. However, a separate PCB, which will be referred to herein as the reader PCB 54, has the jack 60 to receive the wired connection by a maintenance device. The main PCB 53 can be connected to the reader PCB 54 by a flexible wire, for instance. This reader PCB 54 is secured to the frame portion 46 of the second pack 22. In this embodiment, and for reasons made apparent below, this jack 60 is provided in the form of a USB programming port, and the reader PCB 54 further has a 6 pin antenna PCB connection 62. Batteries 50, as well as optional RF transceiver 56, and an optional Bluetooth™ module 58 are also mounted to the tray portion 48 for easy maintenance. It will be understood that in alternate embodiments, the controller can be embodied in various forms, and in more than one separate components which can communicate with one another in a wired or a wireless manner. One or more component of the controller can be included in the first pack 24 rather than in the second pack 22. In any event, the controller can typically act as some form of computer, for example by having some form of processor receiving the input from the reader interface 38, comparing this input to some form of credential data stored in some form of memory, and controlling the lock actuator based on the result of the comparison. Accordingly, the electronic key can be provided in any suitable form such as a card, key fob or smartphone for instance, and can communicate with the reader in any suitable contact or contactless manner such as RFID, Bluetooth™, or any other suitable technology.

The main PCB 53 can be connected to the reader PCB 54 by one or more flexible wire(s) (not shown) which accommodate relative displacement between the main PCB 53 and reader PCB 54 when the tray portion 48 is slid within the frame portion 46. This flexible wire connection can be conveniently held, at one end, against the frame portion 46 near the maintenance jack 60 by two conveniently positioned tabs 99a, 99b, and at the other end, against the tray portion 48 by a conveniently positioned tab 80b. Similarly, tab 80a can be provided to guide the location of the wire 72 used to connect the main PCB 53 to the lock actuator. Additional tabs can be provided to guide the location of any other wire connecting electronic components to the main PCB, for instance. Such tabs can be particularly useful to hold wires which interconnect a component in the tray portion 48 to a fixed component.

The battery 50 is held in place in the tray portion 48 by a battery holder 81. In this embodiment, the battery holder 81 is provided in the form of a spring clip formed of a band of metal having a central depression 85 and two legs having hooks 83a, 83b. The spring clip is elastically deformable/resilient. The tray portion 48 is provided with two apertures 87a, 87b which are sized to receive corresponding hooks 83a, 83b, when the legs are flexed towards one another, and the legs can then be released for the hooks to become trapped under the corresponding edge of the corresponding aperture 87a, 87b. The spring clip is designed for the central depression 85 to have a slight interference with the battery pack 50 when the battery pack 50 is held therein such as shown in FIG. 3b. In this configuration, the battery pack 50 exerts an outward force on the central depression 85, maintaining the central depression 85 in a tensed, deformed state, and the hooks 83a, 83b are also forced outwardly, against the corresponding edges of the corresponding apertures 87a, 87b. The amplitude of the force, and the amount of deformation in the central depression 85, varies as a function of the thickness of the battery pack. This arrangement allows to snugly receive battery packs of varying thickness, within a given thickness range determined by the shape/amount of curvature of the central depression 85, which can be advantageous in some embodiments. In alternate embodiments, the battery holder can rather be provided in the form of tight fit tabs designed for a specific type of battery pack, for instance.

Figure 5:
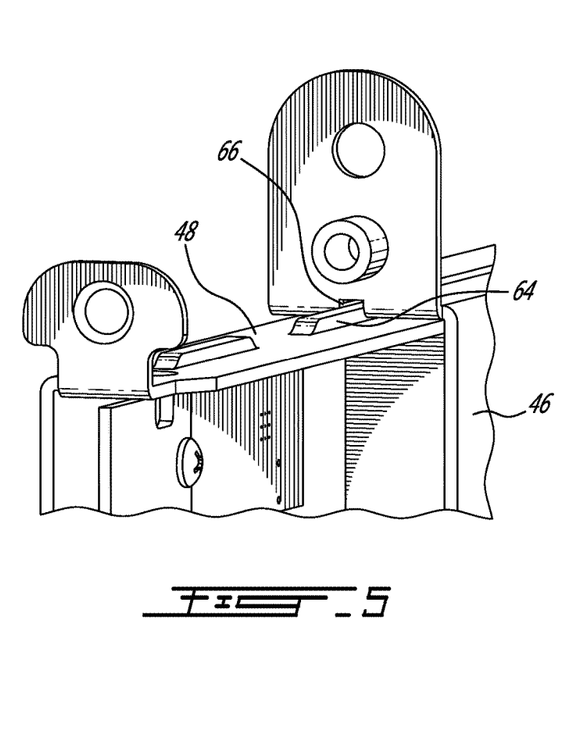
FIG. 5 is an oblique view showing the rail and stopper system of the second pack.
Figure 6:
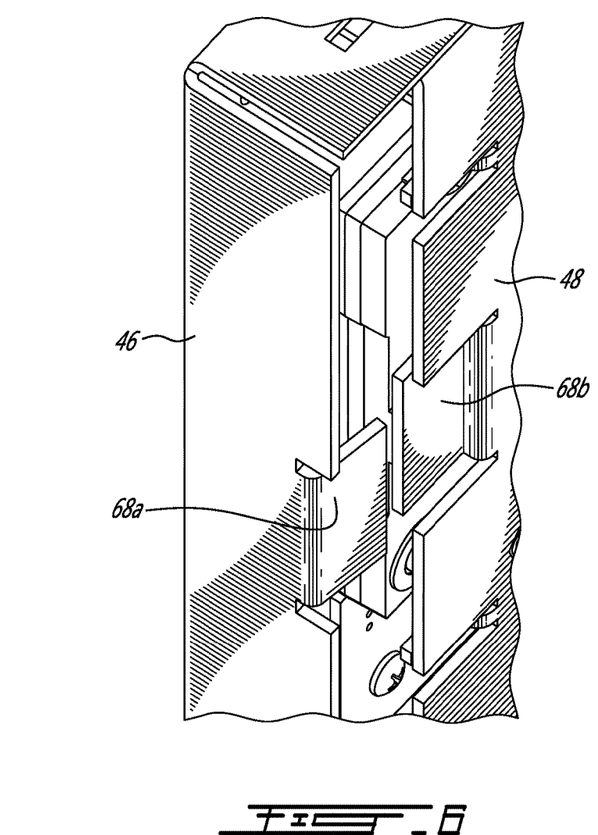
FIG. 6 is an oblique view showing locking tabs of the second pack.

The sliding mount between the tray and the frame portions 48, 46 includes a rail system, with elongated protrusions 64 on the upper and lower edges of the tray portion 48 being received in mating elongated slots 66 on the upper and lower edges of the frame portion 46, so as to form a snug sliding engagement. Optionally, stops can be provided in the mating edges of the frame and tray in a manner that when the tray is fully slid into the extended position, the stops will come into contact with one another and prevent extending the tray further out unless a significantly increased amount of force is exerted to overcome the bias from the stops. In the embodiment where the reader PCB 54 is connected to the main PCB 53 via a wired connection, the wired connection may need to be disconnected to allow full removal of the tray portion 48. At the internal edge relative to the direction of sliding, the tray 48 and frame 46 are provided with snugly engaging tabs 68a, 68b better shown in FIG. 6. These tabs 68a, 68b, once engaged, form a snug engagement and were found to reduce or prevent any rattling or unsuitable vibration which could otherwise occur as the door 12 is being manipulated and the tray 48 and the frame 46 portions are slightly moved relative to one another. It will also be noted that the main sheet metal components forming the tray portion 48 and the frame portion 46 are symmetrical along an axis parallel to the sliding orientation, so as to be freely usable either in a left hinged or a right hinged door, simply by changing the position of some of the electronic components.

Figure 7A:
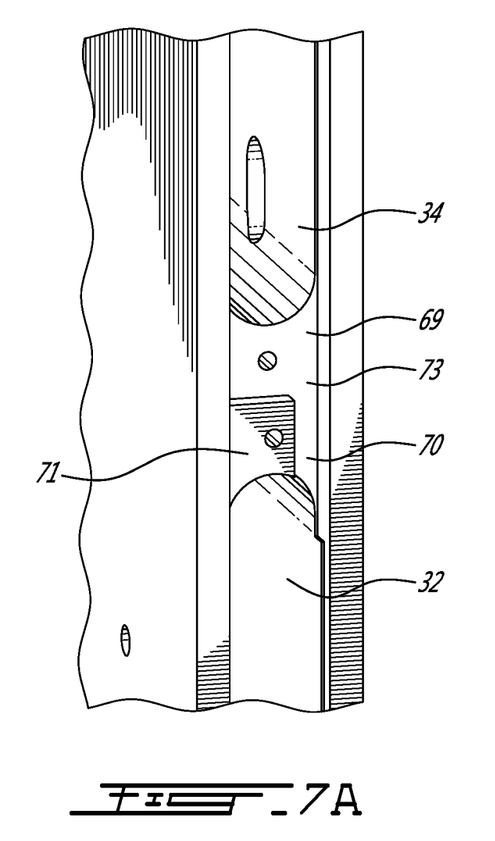
FIGS. 7A and 7B are views showing, in sequence, the assembly of the locking system to the door.
Figure 7B:
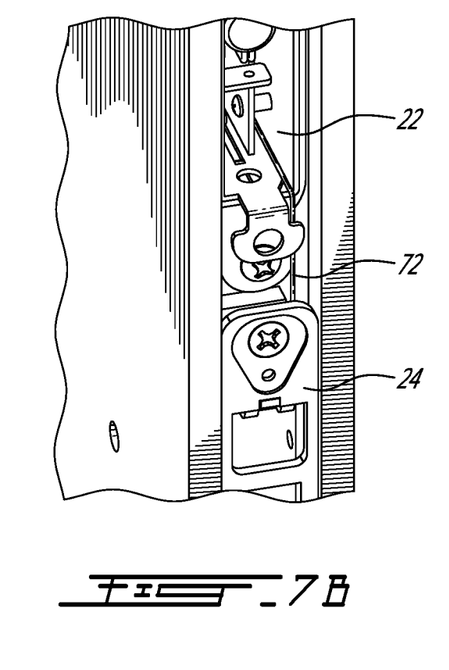
Figure 8A:
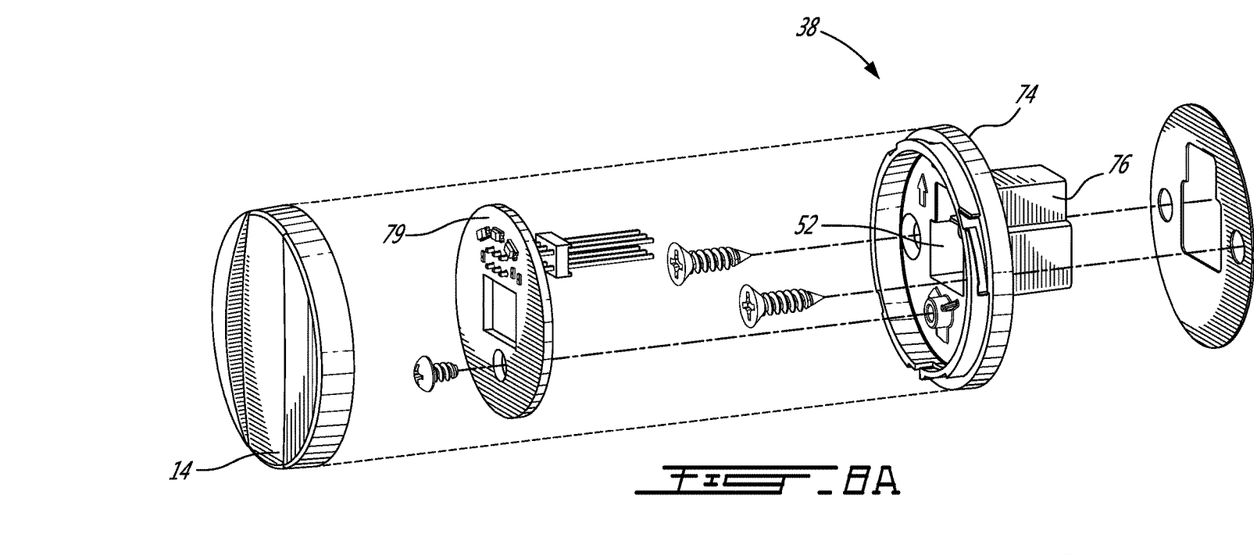
FIG. 8A is an exploded view of a reader antenna assembly of the locking system, with FIG. 8B being a rear view of a component thereof.
Figure 8B:
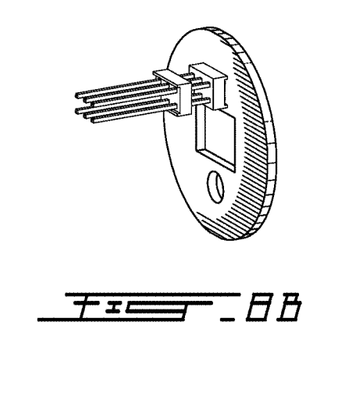
Figure 9:
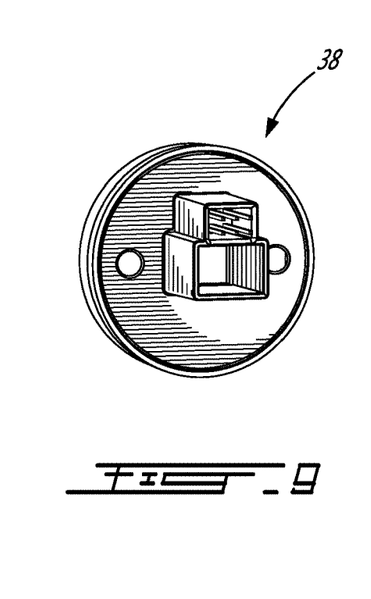
FIG. 9 is a rear view of the reader antenna assembly of the locking system, assembled.
Figure 10:
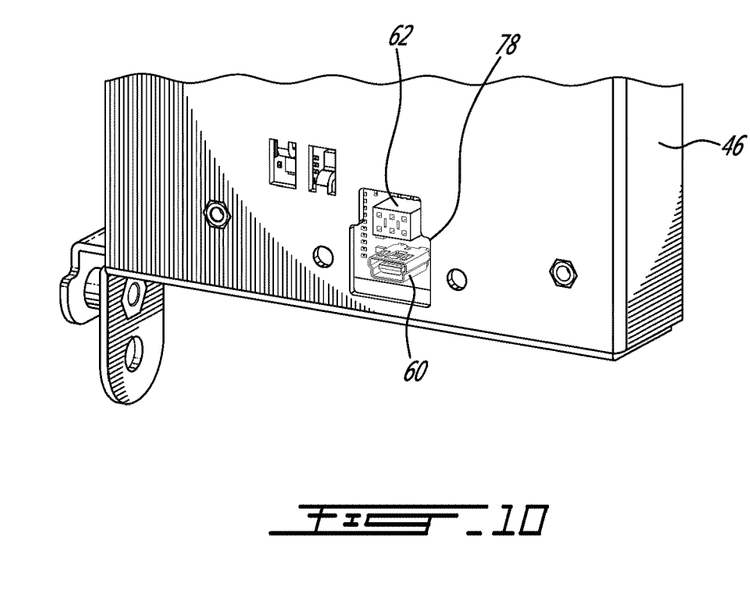
FIG. 10 is an oblique view of the second pack, fragmented.

In the illustrated embodiment, the first pack 24 and the second pack 22 are to be provided as separate, independent housings ("assemblies" instead of "housings"?), and are electrically connected in a wired manner. As shown in FIG. 7A, when the mortise is machined in the wood material of the door, a channel 70 is designed to extend between the first recessed area 32 (provided here as a first pocket) and the second recessed area 34 (provided here as a second, distinct pocket). The first pack 24 and the second pack 22 can then be mounted to the corresponding areas, and a wire 72 can extend within the channel 70 to connect the main PCB 53 with the lock actuator in the first pack 24. More specifically, in this embodiment, the mortise further includes a separator 69 between the first recessed area 32 and the second recessed area 34. An outer face of the separator includes a first planar area 73, and a step 71 protruding from the first planar area 73. The channel 70 is provided between the step 71 and a first edge of the mortise, and is further delimited by the first planar area 73. The channel 70 can thus be said to be generally rectangular in cross-section. Mounting the first pack 24 includes fastening a first flange against the step 71 using a corresponding wood screw. Mounting the second pack 22 includes fastening a second flange against the first planar area 73 using a corresponding wood screw, after which the wire 72 extends between the first flange and the first planar area 73. The lock actuator in this embodiment is an electric motor, and the wire 72 can further be used to connect a privacy switch and door ajar switch both made integral to the first pack 24. In another embodiment, the first pack 24 could additionally include a mechanical key override, for instance. FIG. 8 shows the reader assembly 38 of this particular example in further detail. As shown in FIG. 8, the reader assembly has a base 74 which is adapted to be secured to the door 12 with base mounting screws. More specifically, as shown in FIG. 9 and FIG. 10, the base has a male locating feature 76 and the frame has a correspondingly shaped female locating feature 78. Accordingly, the base is positioned by engaging the male locating feature 76 into the female locating feature 78 across the aperture 36 in the door 12 (FIG. 2), and the mounting screws are then used to secure the base 74 into place. An interface PCB 79 is made integral to the base, and is connected to a corresponding jack 62 in the reader PCB 54 which is secured to the frame portion 46 when the base 74 is in its secured position. More specifically, once the base 74 is secured to the door 12, the interface PCB can be inserted easily via the pins on the reader PCB 54 in the controller pack. The interface PCB 79 can have an antenna to receive the input from the electronic key, for instance, and can also have one or more indicators, such as LEDs, to provide visual or audible feedback to the user.

It will be noted that the reader PCB 54 has a maintenance jack 60, and that the base 74 of the reader assembly 38 is provided with an aperture 52 leading to the maintenance jack 60 of the PCB. Accordingly, by removing the cover 14, a maintenance technician can insert a plug into the maintenance jack 60, and gain access to the controller, for instance. This can be useful to perform a debugging operation for instance. In this embodiment, the maintenance jack is a USB jack which is used as an easily accessible programming port.

Figure 11:
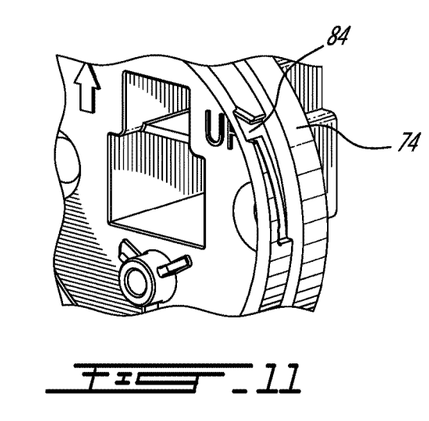
FIG. 11 is an oblique view showing the base rotational assembly feature of the reader antenna assembly.
Figure 12:
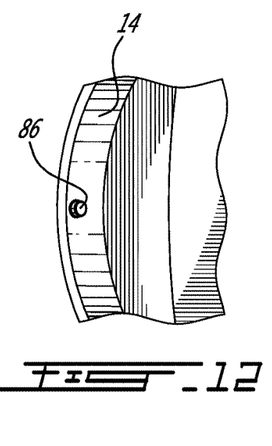
FIG. 12 is an oblique view showing the cover rotational assembly feature of the reader antenna assembly.
Figure 13:
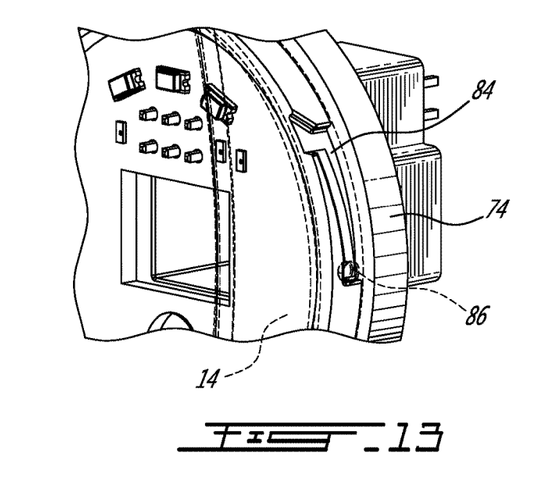
FIG. 13 is an oblique view showing the components of FIGS. 11 and 12 assembled.

As shown in FIGS. 11 to 16, the cover and base are provided with a plurality of mating features to allow the selective engagement or disengagement of one from the other. More specifically, FIG. 11 shows a base rotational assembly feature provided in the form of a groove 84 forming a longitudinal and then circumferential path along a portion of the base 74. As shown in FIG. 12, the cover 14, on an internal side wall, is provided with a protrusion 86 which is shaped to engage the groove 84. Accordingly, when the cover 14 is correctly positioned on the base 74, the protrusion 86 engages the groove 84 and becomes trapped in the groove 84. Pushing the cover axially, and then turning the cover clockwise results in driving the protrusion 86 to the end of the groove, in the position illustrated in FIG. 13. A catch can optionally be provided at the end of the groove.

Figure 14:
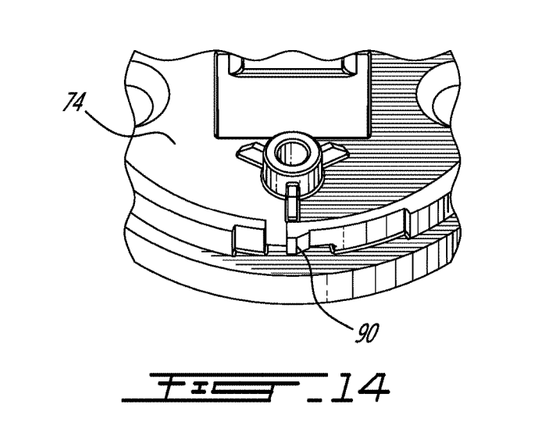
FIG. 14 is an oblique view of the base snap locking feature of the reader antenna assembly.
Figure 15:
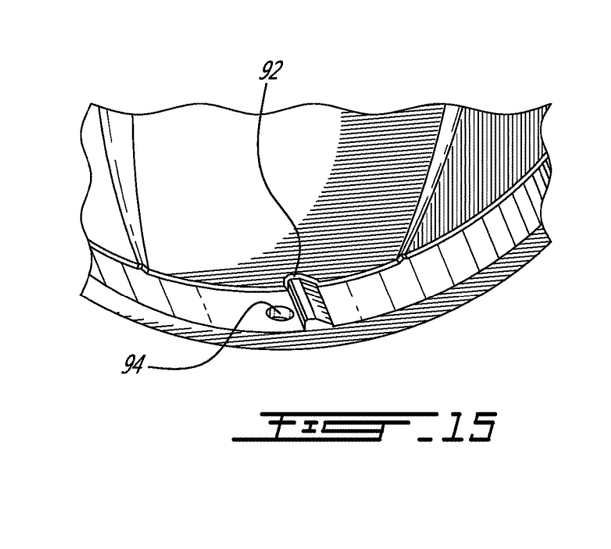
FIG. 15 is an oblique view of the cover snap locking feature of the reader antenna assembly.
Figure 16:
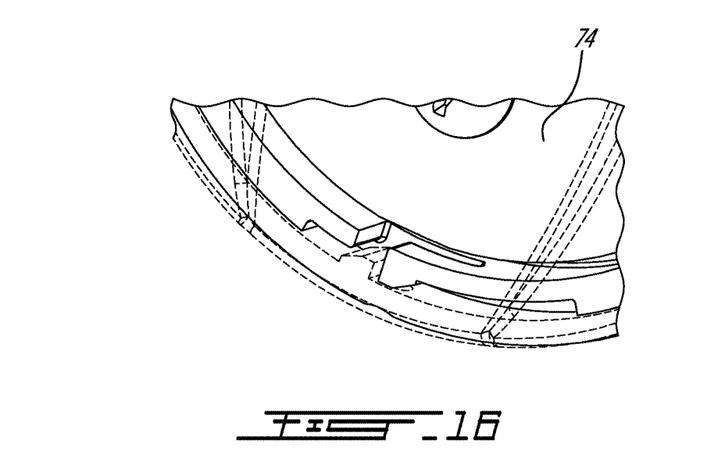
FIG. 16 is an oblique view showing the features of FIGS. 14 and 15 assembled.

FIG. 14 shows a base snap locking feature embodied as a hook 90, whereas FIG. 15 shows a cover snap locking feature embodied as a catch 92. Indeed, when the cover 14 is in position with the protrusion 86 at the end of the groove 84, the hook 90 has simultaneously tripped over the catch 92, and the hook 90 then prevents rotation of the cover 14 in the counter-clockwise orientation, preventing the removal of the cover 14 from the base 74. However, the cover 14 is provided with a small aperture 94 allowing the insertion of a small pin into contact with the hook 90, to remove the hook 90 from interference with the catch 92, and thus allow removal of the cover 14.

It will be noted that in this embodiment, the battery is held with a spring clip. The second pack can have protruding features opposed between the tray portion and the frame portion, that act as a stop to limit the extension of the tray within the frame, unless overcome using some force (e.g. when installing the tray). For instance, with reference to FIG. 4, in the embodiment, shown, dimples 95a, 95b protrude outwardly from upper and lower flanges of the tray portion 48, and dimples 97a, 97b protrude inwardly from the upper and lower flanges of the frame portion 46. When the tray portion 48 is pulled out to the design limit, the dimples 95a, 95b engage a corresponding dimple 97a, 97b to limit the sliding extent. If required, the restraining action of the dimples can be overcome by a level of force which is significantly higher than the level of force required for sliding the tray. This conveniently retains the tray 48 in the frame 46 at a distance allowing easy accessibility to the battery 50 and battery connection on the main PCB 53. The reader antenna assembly 38 houses the reader antenna PCB 79 and allows easy access to the programming port 52 for the lock. It is designed to be tamper resistant so you need a common tool such as a paper clip to remove the cover 14 from the base 78. The base 78 and cover 14 have rotational assembly features on either side that secure the cover to the base and act to maintain the orientation of the cover. The reader antenna PCB 79 contains LEDs for user feedback, an antenna coil and 6 pin header connector to connect to reader PCB 54 inside controller assembly 22. In the illustrated embodiment a ferrite backing is used to enable better performance if used on a metal clad door or with an under plate. Removal of the 2 faceplate screws allows access to the sliding maintenance tray 46. Once the screws are removed, the tray can be slid from the door to gain access to the battery 50 and battery connector while being retained in the door with the dimples on the case. To do further maintenance if a circuit board change is required, the tray 48 can be pulled past the retention dimples with more force and the circuit boards will be accessible. The reader PCB 54 that is secured to the frame 46 of the second pack 22 cannot be accessed without first removing the frame 46 from the door 12. The tray 48 can be used to facilitate operations such as changing the battery 50, performing maintenance on the main PCB 53 (e.g., replace it), replacing the optional RF board 56 or BLE board 58 should they need to be replaced, or, if the lower pack 24 ever needed to be replaced, this could require access to the main board 53 for the switch/motor connections, to name a few examples.

As can be understood, the examples described above and illustrated are intended to be exemplary only. For instance, in the case of a locking system adapted for a powered door, the locking system does not need batteries nor a battery holder. The scope is indicated by the appended claims.

What is claimed is:

1. A locking system for controlling the unlocking of a door by an electronic key, the locking system comprising: a first pack configured to be received within a first recessed area of the door, the first pack having at least one bolt and an actuator configured and adapted to unlock the door; a second pack configured to be received within a second recessed area of the door; a reader interface adapted to receive an input from the electronic key and a controller adapted to receive the input from the reader interface, authenticate the input, and control the actuator based on the authentication; wherein the door has an aperture extending normal to a face of the door, and leading into the second recessed area, further comprising a maintenance jack secured to the second pack and exposed to the aperture, the maintenance jack configured to receive a wired connection by a maintenance device; and a cover removably securable to the door to cover the aperture.

2. The locking system of claim 1 wherein the second pack has a frame fastenable to the door, and a tray being slidably mounted to the frame in a manner that the tray can be slid out from the second recessed area to expose a portion thereof for maintenance.

3. The locking system of claim 2 wherein the frame and the tray form two opposite faces of the second pack, the face of the tray being on an inner side of the door, the sliding mount of the tray including an upper rail and a lower rail.

4. The locking system of claim 3 wherein an inner end of the frame and of the tray are provided with mating tabs being snugly received against one another when the tray is slid fully inwardly.

5. The locking system of claim 2 further comprising a faceplate removably fastened to an outer end of the second pack and preventing the sliding of the tray unless unfastened.

6. The locking system of claim 2 wherein the tray has a battery holder adapted to receive at least one battery, the battery being exposed for maintenance when the tray is slid out from the frame.

7. The locking system of claim 6 wherein the battery holder includes a spring clip formed of a band of metal having a central depression and two legs securable to the tray, the central depression being elastically deformed by the battery when the battery is received between the central depression and the tray.

8. The locking system of claim 2 wherein at least one component of the controller is secured to the tray in a manner to be exposed for maintenance when the tray is slid out from the frame.

9. The locking system of claim 8 wherein the at least one component of the controller secured to the tray is a main printed circuit board (PCB) of the controller.

10. The locking system of claim 2 the tray and the frame are both symmetrical along an axis parallel to the sliding orientation, and can thereby be used either in a left hinged or a right hinged door by rotating it by 180 degrees.

11. The locking system of claim 1 further comprising a reader assembly including a base securable to the door and receiving the reader interface, wherein the cover is securable to the door via the base.

12. The locking system of claim 1 provided in combination with the door, wherein the door has a mortise having a first pocket receiving the first pack, and a second pocket receiving the second pack, a separator between the first pocket and the second pocket, an outer face of the separator including a first planar area and a step protruding from the first planar area, and a channel is provided between the step and a first edge of the mortise and extending from the first pocket to the second pocket, the channel receiving a wire connecting the first pack to the second pack.

13. The locking system of claim 12 wherein the wire more specifically connects a main PCB of the first pack to a lock actuator of the second pack.

14. A locking system for controlling the unlocking of a door by an electronic key, the locking system comprising: a pack configured to be received within a recessed area of the door; a reader interface adapted to receive an input from the electronic key and a controller adapted to receive the input from the reader interface, authenticate the input, and control the actuator based on the authentication, wherein the door has an aperture normal to a face of the door and leading into the recessed area second recess, further comprising a maintenance jack secured to the pack frame and exposed to the aperture, the maintenance jack being configured to receive a wired connection by a maintenance device, and a cover removably securable to the door to cover the aperture.

15. The locking system of claim 14 wherein the pack has a frame fastenable to the door, and a tray being slidably mounted to the frame in a manner that the tray can be slid out from the second recessed area to expose a portion thereof for maintenance.

16. The locking system of claim 15 wherein the frame and the tray form two opposite faces of the second pack, the face of the tray being on an inner side of the door, the sliding mount of the tray including an upper rail and a lower rail.

17. The locking system of claim 14 wherein an inner end of the frame and of the tray are provided with mating tabs being snugly received against one another when the tray is slid fully inwardly.

18. The locking system of claim 15 further comprising a faceplate removably fastened to an outer end of the second pack and preventing the sliding of the tray unless unfastened.

19. The locking system of claim 15 wherein the tray has a battery holder adapted to receive at least one battery, the battery being exposed for maintenance when the tray is slid out from the frame.

20. The locking system of claim 19 wherein the battery holder includes a spring clip formed of a band of metal having a central depression and two legs securable to the tray, the central depression being elastically deformed by the battery when the battery is received between the central depression and the tray.

21. The locking system of claim 15 wherein at least one component of the controller is secured to the tray in a manner to be exposed for maintenance when the tray is slid out from the frame.

22. The locking system of claim 21 wherein the at least one component of the controller secured to the tray is a main printed circuit board (PCB) of the controller.

23. The locking system of claim 15 the tray and the frame are both symmetrical along an axis parallel to the sliding orientation, and can thereby be used either in a left hinged or a right hinged door by rotating it by 180 degrees.

* * * * *